United States Patent
Dietrich et al.

(10) Patent No.: US 6,480,024 B2
(45) Date of Patent: Nov. 12, 2002

(54) CIRCUIT CONFIGURATION FOR PROGRAMMING A DELAY IN A SIGNAL PATH

(75) Inventors: Stefan Dietrich, Türkenfeld; Thomas Hein; Patrick Heyne, both of München; Michael Markert, Augsburg; Thilo Marx, Villingen-Schwenningen, all of (DE); Torsten Partsch, Chapel Hill, NC (US); Sabine Schöniger Kieser, Hausham (DE); Peter Schrögmeier, München (DE); Michael Sommer, München (DE); Christian Weis, Germering (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/046,395

(22) Filed: Oct. 19, 2001

(65) Prior Publication Data
US 2002/0079925 A1 Jun. 27, 2002

(30) Foreign Application Priority Data
Oct. 19, 2000 (DE) .......................................... 100 51 937

(51) Int. Cl.⁷ .......................................... H03K 19/0173
(52) U.S. Cl. ............................... 326/38; 326/82; 326/93
(58) Field of Search ............................... 326/93, 83, 82, 326/37, 38, 95–98

(56) References Cited

U.S. PATENT DOCUMENTS

| | | | |
|---|---|---|---|
| 4,590,388 A | | 5/1986 | Clemons et al. |
| 5,243,227 A | * | 9/1993 | Gutierrez et al. ........... 326/114 |
| 6,204,694 B1 | * | 3/2001 | Sunter et al. ................. 326/93 |
| 6,239,616 B1 | * | 5/2001 | Churcher et al. ............. 326/27 |

FOREIGN PATENT DOCUMENTS

| | | |
|---|---|---|
| DE | 288 689 A5 | 4/1991 |
| DE | 41 12 077 A 1 | 10/1992 |
| DE | 42 35 317 A1 | 5/1993 |
| DE | 199 22 712 A 1 | 11/1999 |
| JP | 07 264 021 | 10/1995 |

* cited by examiner

Primary Examiner—Michael Tokar
Assistant Examiner—Don Phu Le
(74) Attorney, Agent, or Firm—Laurence A. Greenberg; Werner H. Stemer; Ralph E. Locher

(57) ABSTRACT

A circuit configuration includes two signal path sections that are used to program the delay of a signal path, in particular in DRAMs. The two signal path sections have different delays and can be driven in parallel at the input end. The two signal path sections can be connected to an output terminal via a multiplexer. A selection circuit includes two signal path sections which are connected between supply voltage potentials. The selection circuit has two complimentary transistors which are connected in series and has source-end programmable elements. These transistors can be driven by complimentary control signals. This permits the delay to be programmed flexibly with little expenditure on circuitry.

8 Claims, 2 Drawing Sheets

CIRCUIT CONFIGURATION FOR PROGRAMMING A DELAY IN A SIGNAL PATH

BACKGROUND OF THE INVENTION

Field of the Invention

The invention relates to a circuit configuration for programming a delay in a signal path.

In integrated circuits, in particular in semiconductor memories of the dynamic type, what are referred to as DRAMs (Dynamic Random Access Memories), it is necessary for the same circuit design to be configured for different application purposes. In addition, there is a need to set functional properties in dependence on fluctuations in the manufacturing process. To do this, programmable connections, referred to a fuses, are conventionally used. These fuses can either be programmed to be switched on via an additional metal conductor track or programmed to be switched off by means of energy pulses. As a result, it is possible to set delays in signal paths within the DRAM, or a circuit design can be adapted to different module variants. The metal-programmable or fusible connections are referred to as metal options or fusible options.

Published German Patent Application DE 199 22 712 A1 discloses a phase interpolator with a delay interpolation circuit. Various signal paths whose delay can be varied are disclosed. The delay is achieved by means of respectively assigned currents with different current strengths. The currents are made available by thermometer digital/analog converters.

Published German Patent Application DE 41 12 077 A1 discloses a programmable logic module in which a delay stage is connected between a combinatorial logic operation circuit and the macro cell. The delay of the delay stage can be switched between two levels as a function of a control signal.

SUMMARY OF THE INVENTION

It is accordingly an object of the invention to provide a circuit for programming a delay in a signal path which overcomes the above-mentioned disadvantageous of the prior art apparatus of this general type. In particular, it is an object of the invention to provide such a circuit, which includes a particularly small number of components and which can be easily programmed.

With the foregoing and other objects in view there is provided, in accordance with the invention, a circuit configuration for programming a delay in a signal path, which includes: an input terminal for receiving an input signal; an output terminal for providing an output signal; a first signal path section with a first delay, the first signal path section having an input end connected to the input terminal and having an output end; a second signal path section with a second delay that is different from the first delay of the first signal path section, the second signal path section having an input end connected to the input terminal and having an output end; and a multiplexer having an input connected to the output end of the first signal path section and the output end of the second signal path section, the multiplexer having an output connected to the output terminal. The circuit configuration also has a drive circuit that includes supply terminals for receiving a supply voltage, and a first path connected between the terminals for receiving the supply voltage. The first path includes two transistors connected together to define a first node. The first path includes a first programmable path section and a second programmable path section. One of the first programmable path section and the second programmable path section is programmed to be switched on and the other one of the first programmable path section and the second programmable path section is programmed to be switched off. The drive circuit also includes a second path that is connected between the terminals for receiving the supply voltage. The second path includes two transistors connected together to define a second node. The second path includes a first programmable path section and a second programmable path section. One of the first programmable path section of the second path and the second programmable path section of the second path is programmed to be switched on and another one of the first programmable path section of the second path and the second programmable path section of the second path is programmed to be switched off. The two transistors of the first path are controllable by complimentary control signals. The two transistors of the second path are also controllable by the complimentary control signals. The multiplexer has a control input that is connected to the first node and the second node.

The circuit configuration according to the invention has a small number of components. The two signal path sections have a different signal transit time are thus driven in parallel at the input end and each generate an output signal in accordance with their set delay. At the output end, just one of the two delayed signals made available is tapped. The multiplexer is used for this, and it selects one signal path section or the other by means of metal options or fusible options. The selection circuit is space-saving. The selection circuit includes four metal options or fusible options and four transistors having paths connected in the center. By means of a preset control signal, a setting of the drive circuit is selected and accordingly a setting of the multiplexer is selected. The significant factor is that just one of the options per path section is programmed to be switched on and the other is switched off.

In accordance with an added feature of the invention, the drive signal, which operates the drive circuit, is set by means of what is referred to as a bonding option. To do this, the drive signal is tapped by a terminal face, referred to as a bond pad, which is connected by a bonded connection to a terminal for the positive pole of the supply voltage or alternatively to a terminal for the negative pole of the supply voltage. In this way, the signal which presets the drive circuit has a predefined high level or low level.

To carry out the configuration, the drive circuit is first programmed with a metal option by means of the last mask while the semiconductor chip is being manufactured. Instead of the metal option, the fusible option can be used in which a connection is melted with a laser. After the integrated circuit has been tested, the precise desired delay is finally set by means of the bonding option. Overall, a flexible setting of a delay for a signal path is set with the possibility of intervening at various points in the manufacturing process of the integrated circuit.

In accordance with an additional feature of the invention, there is provided, capacitors and third programmable path sections for connecting the capacitors in either the first signal path section or the second signal path section.

In accordance with another feature of the invention, the two transistors of the first path include an n-type channel MOS transistor and p-type channel MOS transistor, and the two transistors of the second path include an n-type channel MOS transistor and p-type channel MOS transistor.

In accordance with a concomitant feature of the invention, the circuit configuration includes: a first metal line and a second metal line. The first programmable path section of the first path includes a first terminal connected to the first metal line when the first programmable path section is programmed to be switched on. The first terminal is not connected to the first metal line when the first programmable path section is programmed to be switched off. The second programmable path section of the second path includes a second terminal connected to the second metal line when the second programmable path section is programmed to be switched on. The second terminal is not connected to the second metal line when the second programmable path section is programmed to be switched off.

Other features which are considered as characteristic for the invention are set forth in the appended claims.

Although the invention is illustrated and described herein as embodied in a circuit configuration for programming a delay in a signal path, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description. of specific embodiments when read in connection with the accompanying drawings.

DESCRIPTION OF THE PREFERRED EMBODIMENTS

Figure 1:
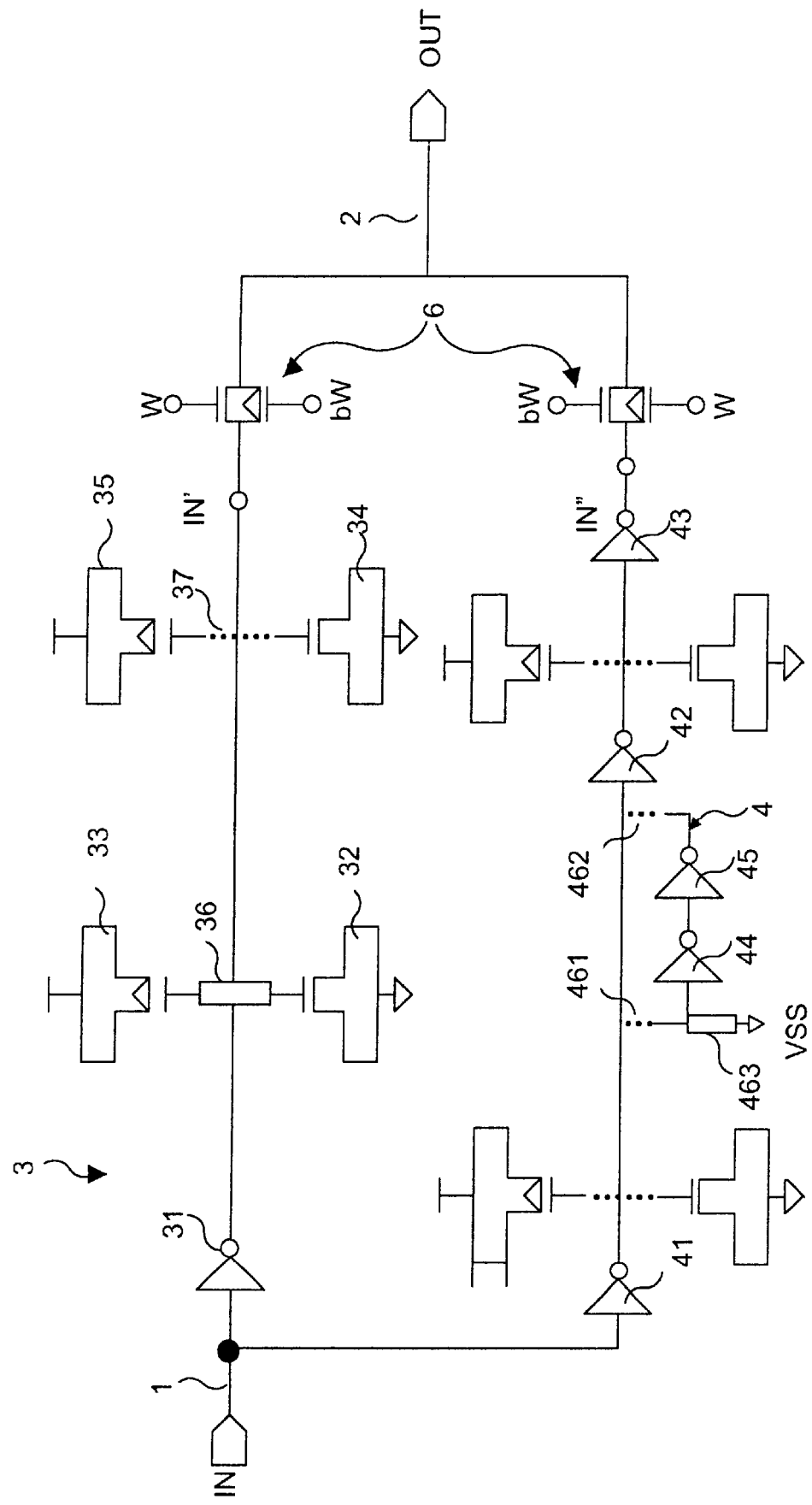
FIG. 1 shows a circuit portion of a DRAM that includes two signal paths.

Referring now to the figures of the drawing in detail and first, particularly, to FIG. 1 thereof, there is shown a portion of a circuit of a DRAM. The signal path whose delay is to be set lies between the terminals 1 and 2. A digital input signal IN is fed in at the terminal 1, and a correspondingly delayed output signal OUT is tapped at the output 2. Two signal paths 3, 4 are provided which are connected at the input end to the terminal 1. At the output end, the signal paths 3, 4 are connected to the input terminals of a multiplexer 6. The multiplexer 6 is driven by a control signal which includes complimentary components. The output terminal of the multiplexer 6 is connected to the output 2 of the circuit.

Figure 2:
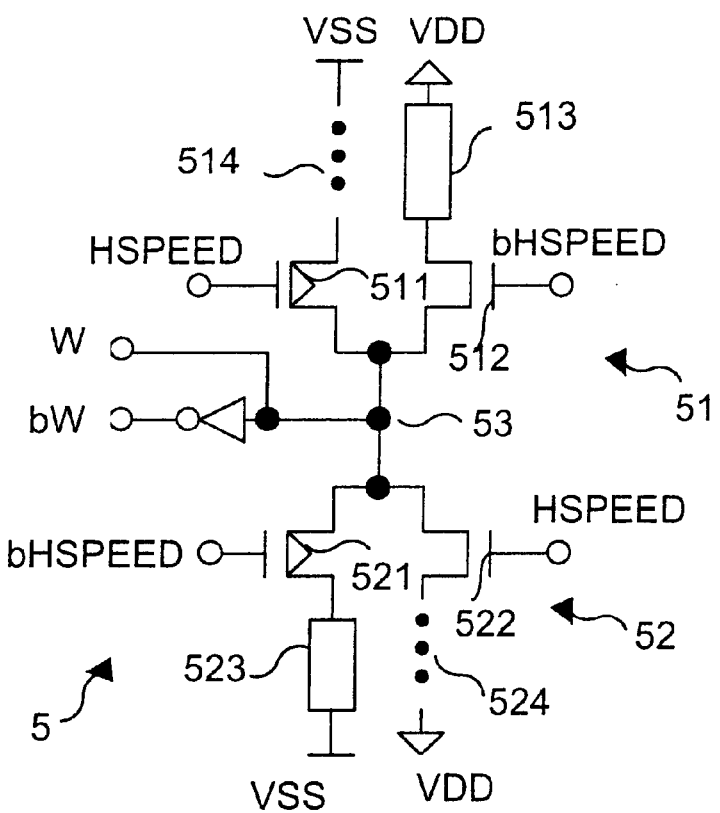
FIG. 2 shows a drive circuit that generates drive signals for the multiplexer.

FIG. 2 shows a drive circuit 5 that generates the control signal W, bW of the multiplexer. The drive circuit 5 includes two signal paths which are connected between terminals for the supply voltage VDD, VSS and are coupled to a central node in order to make available the signal W or bW. The signal paths 51, 52 include transistors 511, 512 or 521, 522, respectively, the drain-source paths of which are connected in series. The source terminals of the transistors are connected via a metal option to the respective terminal for one of the supply potentials VDD, VSS. In the exemplary embodiment illustrated in FIG. 2, the transistor 512 is connected to the terminal for the supply potential VDD via a metal option 513 constituting a conductive connection, and the transistor 521 is connected to the terminal for the supply voltage VSS by means of a metal option 523 which is also programmed to be on. The other metal options are not programmed, i.e. they are switched off. The source terminal of the transistor 522 is thus connected to the terminal for the positive supply potential VDD via the non-programmed metal option 524 which is switched off, and the transistor 511 is connected to the terminal for the negative supply potential VSS via the metal option 514 which is switched off.

The respective transistors of the signal paths 51, 52 are MOS transistors of the complimentary channel type. The transistors 512, 522 are n-type channel MOS transistors, and the transistors 511, 521 are p-type channel MOS transistors. The transistors of one of the signal paths are driven by complimentary components of a control signal. The transistors of the same type of transistor (respectively p-type channel or respectively n-type channel transistors) of different signal paths are also driven by the complimentary components of this control signal. The transistors 521, 512 are thus controlled by the signal bHSPEED, and the transistors 522, 511 are controlled by the HSPEED control signal which is complimentary thereto. By suitably programming the programmable path sections 513, 514, 523, 524 and suitably setting the drive signals HSPEED, bHSPEED, a multiplicity of programming and setting possibilities are obtained for generating the drive signal W, bW for the multiplexer 6. Either only the option 513 is programmed to be switched on and the option 514 switched off, or vice versa. The same applies to the options 523 and 524.

Figure 3:
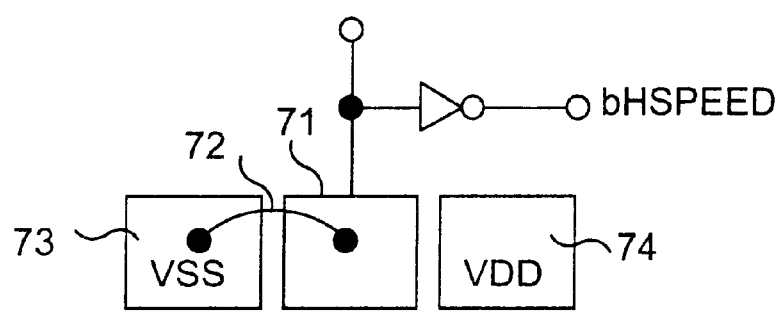
FIG. 3 shows a bonding option that is used for generating signals for the drive circuit.

The metal options shown in the drive circuit 5 are individualized by the application of the last metal layer to the layered structure of the integrated circuit. Alternatively, instead of metal options, it is possible to provide meltable fuses that are switched on in the preset state and are disconnected by means of an energy pulse, for example, laser or fusing current. Generally, the metal options and fuses are programmable path sections which are permanently set to be switched on or switched off. The signal HSPEED or bHSPEED is then set, preferably by means of what is referred to as a bonding option. FIG. 3 shows a bonding option for setting the signals HSPEED and bHSPEED. A terminal face 71 is provided which is connected in the example shown to a terminal face 73 for the reference potential VSS by means of a bonding wire 72. Alternatively, it is possible to connect the terminal face 71 to the terminal face 74 for the positive supply potential VDD.

The two signal paths 3, 4 have different signal transit times for the signal IN fed in to them at the terminal 1 at the input end. The delayed signals IN', IN" which are present at the output of the signal path sections 3, 4 are generated in parallel. One of the signals is then selected by means of the multiplexer 6 and passed on to the output terminal 2. The signal path section 3, 4 have a different number of inverters 31 or 41, 42, 43 which are connected in series with respect to the input/output signal paths. Moreover, metal options or fusible options are provided in order to connect capacitors, which are connected to terminals for the supply voltage, to the signal path section 3 or 4. As a result, a different delay can be set for the signal path sections 3, 4. Capacitors 32, 33, 34, 35, which can be connected to the signal path section via a metal option 36 or 37, are thus provided. The metal option 36 is programmed to be switched on as a metal conductor track, and the metal option 37 remains switched off in the initial state. Corresponding capacitors and metal options are made available for the signal path section 4. There, the metal options are always switched off. Moreover, it is advantageous, if appropriate, to connect further inverters into the signal path 4 by means of metal options. Two inverters 44, 45 connected in series are provided as spares, and can be connected to the signal path section 4 by means of two options 461, 462. In the example shown, the metal options 461, 462 are embodied in the switched off state, and instead the input of the inverter 44 is connected to the terminal for reference potential VSS via a metal option 463 which is embodied in the switched on state.

In the exemplary embodiment illustrated, the signal HSPEED has a low level. The signal bHSPEED has a high level. The transistor 512 is thus switched on and the transistor 521 is switched off. The signal W has a high level and selects the signal path section 3 in the multiplexer 6. There, the input signal IN is passed on to the output terminal 2 as an output signal OUT with a delay due to inversion by means of the inverter 31 and due to additional delay by the capacitors 32, 33.

The circuits illustrated in FIGS. 1–3 are part of a semiconductor memory module. It is now possible to configure the same semiconductor memory for other application purposes. To do this, the fuses 36, 37, 461, 462, 463 and 513, 514, 523, 524 are, if appropriate, to be programmed in a desirable fashion. The ultimate setting of the multiplexer 6 is then set by means of the bonding option 71, 72, 73, 74.

We claim:

1. A circuit configuration for programming a delay in a signal path, comprising:
    an input terminal for receiving an input signal;
    an output terminal for providing an output signal;
    a first signal path section with a first delay, said first signal path section having an input end connected to said input terminal and having an output end;
    a second signal path section with a second delay that is different from the first delay of said first signal path section, said second signal path section having an input end connected to said input terminal and having an output end;
    a multiplexer having an input connected to said output end of said first signal path section and said output end of said second signal path section, said multiplexer having an output connected to said output terminal; and
    a drive circuit including:
        supply terminals for receiving a supply voltage,
        a first path connected between said terminals for receiving the supply voltage, said first path including two transistors connected together to define a first node, said first path including a first programmable path section and a second programmable path section, one of said first programmable path section and said second programmable path section programmed to be switched on and another one of said first programmable path section and said second programmable path section programmed to be switched off, and
        a second path connected between said terminals for receiving the supply voltage, said second path including two transistors connected together to define a second node, said second path including a first programmable path section and a second programmable path section, one of said first programmable path section of said second path and said second programmable path section of said second path programmed to be switched on and another one of said first programmable path section of said second path and said second programmable path section of said second path programmed to be switched off,
    said two transistors of said first path being controllable by complimentary control signals, and
    said two transistors of said second path being controllable by the complimentary control signals, and
    said multiplexer having a control input connected to said first node and said second node.

2. The circuit configuration according to claim 1, wherein:
    each of said two transistors of said first path has a source terminal; and
    said first programmable path section of said first path is connected between said source terminal of one of said two transistors of said first path and one of said supply terminals;
    said second programmable path section of said first path is connected between said source terminal of another one of said two transistors of said first path and another one of said supply terminals;
    each of said two transistors of said second path has a source terminal; and
    said first programmable path section of said second path is connected between said source terminal of one of said two transistors of said second path and one of said supply terminals; and
    said second programmable path section of said second path is connected between said source terminal of another one of said two transistors of said second path and another one of said supply terminals.

3. The circuit configuration according to claim 2, comprising:
    a device for generating the complimentary control signals;
    said device including a terminal face, a further terminal face, and a bonding wire connecting said terminal face to said further terminal face; and
    said further terminal face for feeding in a potential of the supply voltage.

4. The circuit configuration according to claim 1, comprising:
    a device for generating the complimentary control signals;
    said device including a terminal face, a further terminal face, and a bonding wire connecting said terminal face to said further terminal face; and
    said further terminal face for feeding in a potential of the supply voltage.

5. The circuit configuration according to claim 1, wherein said first signal path section and said second signal path section each include a different number of inverters connected in series.

6. The circuit configuration according to claim 1, comprising capacitors and third programmable path sections for connecting said capacitors in a path selected from the group consisting of said first signal path section and said second signal path section.

7. The circuit configuration according to claim 1, wherein:
    said two transistors of said first path include an n-type channel MOS transistor and p-type channel MOS transistor; and
    said two transistors of said second path include an n-type channel MOS transistor and p-type channel MOS transistor.

8. The circuit configuration according to claim 1, comprising:

a first metal line and a second metal line;

said first programmable path section of said first path includes a first terminal connected to said first metal line when said first programmable path section is programmed to be switched on, said first terminal not being connected to said first metal line when said first programmable path section is programmed to be switched off; and said second programmable path section of said second path includes a second terminal connected to said second metal line when said second programmable path section is programmed to be switched on, said second terminal not being connected to said second metal line when said second programmable path section is programmed to be switched off.

* * * * *